United States Patent [19]

Bradley

[11] Patent Number: 5,056,099
[45] Date of Patent: Oct. 8, 1991

[54] RUGATE FILTER ON DIODE LASER FOR TEMPERATURE STABILIZED EMISSION WAVELENGTH

[75] Inventor: Eric M. Bradley, San Diego, Calif.

[73] Assignee: General Dynamics Corp., Electronics Division, San Diego, Calif.

[21] Appl. No.: 579,933

[22] Filed: Sep. 10, 1990

[51] Int. Cl.$^5$ ............................. H01S 3/19; G02B 1/10
[52] U.S. Cl. ........................................ 372/49; 372/99; 359/577; 359/580
[58] Field of Search ........................ 372/33, 34, 98, 99, 372/102, 108, 45, 46, 49; 350/163, 164, 166

[56] References Cited

U.S. PATENT DOCUMENTS

| | | | |
|---|---|---|---|
| 4,092,659 | 5/1978 | Ettenberg | 357/18 |
| 4,731,792 | 3/1988 | Shimizu et al. | 372/49 |
| 4,915,476 | 4/1990 | Hall et al. | 350/163 |
| 4,951,291 | 8/1990 | Miyauchi et al. | 372/49 |
| 4,951,292 | 8/1990 | Kuindersma et al. | 372/49 |
| 4,975,922 | 12/1990 | Sakane et al. | 372/49 |

OTHER PUBLICATIONS

"Single Wavelength Operation of the Hybrid External Bragg Reflector Waveguide Laser Under Dynamic Conditions", J. M. Hammer et al., *Appl. Phys. Lett.*, 47(3), 1 Aug. 1985, pp. 183–185.

"Monolithically-Integrated Hybrid Heterostructure Diode Laser with Dielectric-Film Waveguide DBR", Zh. I. Alferov et al., *IEEE J. of Quant. Elec.*, vol. QE-23, No. 6, Jun. 1987, pp. 869–881.

"Testing of a Bragg Heterojunction Injection Laser with a Thermally Stable Output Wavelength", S. A. Gurevich, *Sov. Tech. Phys. Lett.*, 11(5), May 1985, pp. 218–220.

U.S. patent application Ser. No. 07/579,602, 9/90, Bradley, E. M.

*Primary Examiner*—William L. Sikes
*Assistant Examiner*—Galen J. Hansen
*Attorney, Agent, or Firm*—Brown, Martin, Haller & McClain

[57] ABSTRACT

The rugate filter comprises a glass film which is deposited on one or both end facets of a diode laser. The glass film has a continuously varying refractive index with thickness, usually in the form of a sine wave or a "windowed" sine wave. Such a film may be deposited by ion-assisted co-deposition techniques in which the concentration of the higher refractive index material is periodically varied according to the period required to produce the desired filter. The glass of which the rugate filter is formed has an average refractive index which does not vary with temperature by more than $10^{-6}/°C$. By reflecting light at the peak wavelength back into the laser, the laser is caused to emit at the desired wavelength. Since the rugate filter selectively reflects light within a narrow band of the desired wavelength, the laser emits light within a narrow peak on the order of 10 Å or less.

6 Claims, 1 Drawing Sheet

RUGATE FILTER ON DIODE LASER FOR TEMPERATURE STABILIZED EMISSION WAVELENGTH

BACKGROUND OF THE INVENTION

I. Field of the Invention

The present invention relates to semiconductor diode lasers and more specifically to temperature-stabilized diode lasers.

II. Background Art

In order to handle the increasing demands for high data rate communications, fiber-optic databus systems require the ability to multiplex wavelengths. The practical range within which wavelengths can be multiplexed is limited by the luminescence spectrum of semiconductor diode lasers, which has a useful band of only 200-300 Å. It is not practical to fabricate a large number of lasers with different compositions to broaden this range to 2,000 to 10,000 Å so as to allow large numbers of channels without temperature-stabilized wavelengths. In order to propagate the greatest number of signals within this narrow spectrum, the wavelengths must be very stable and tightly controlled.

The best wavelength stabilized diode lasers available today are the distributed feedback laser (DFB) and distributed Bragg reflector laser (DBR). In these lasers, rather than using end mirrors, light is reflected from corrugated waveguides (Bragg gratings) back into the laser active area.

Early DFB and DBR lasers used waveguides which were formed from the same material as the active region. Since the material of the active region was chosen to optimize gain properties, not grating properties, some of the grating characteristics were compromised, including temperature stability (due to changes in refractive index with temperature).

The range of operating temperatures over which diode lasers are normally operated is about 20° C. to 70° C. The variation in wavelength is about 5 Å/° C. for laser diodes with conventional cavities, and about 1 Å/° C. for DFB or DBR lasers. Therefore the wavelength will drift about 50 Å over the required temperature range for even the best stabilized lasers.

Thermally-stabilized DBR lasers were described by S. A. Gurevich, et al., Sov. Tech. Phys. Lett. 11(5), May, 1985 and by Zh.I. Alferov, et al., IEEE Journal of Quantum Electronics, Vol. QE-23, No. 6, June, 1987. The lasers described incorporated a corrugated waveguide consisting of multiple dielectric layers, each layer with approximately equal and opposite changes in refractive index of temperature. The effect intended is that there is no net change in refractive index with temperature due to the offset of one layer by another, thus, no resulting change in wavelength occurs.

The monolithic temperature-stabilized lasers of Gurevich, et al. and Alferov, et al. suffer the disadvantage, however, that the processing required to form the waveguide on a single substrate degrades the reliability of the laser facets. After formation of the active layer, the waveguide is formed by selective chemical etching and "micro-cleaving" of the layers, followed by deposition of the dielectric layers. Exposure of the active area to chemical etching compromises the laser's reliability due to cusping or undercut of the laser active area. It is also probable that the long-term reliability of the facets formed by "micro-cleaving" process is not as good as those formed by conventional cleaving. Further, dielectric layers deposited adjacent to the cleaved facet tend to show "edge effects" in that the edges of the dielectric are thicker, forming an edge bead and interfering with coupling between the laser and the waveguide. These lasers are capable of maintaining a stable wavelength within the 5 Å band, which is still severely limiting for wavelength multiplexing when the useful laser band is only 200-300 Å. In addition, because of different coefficients of expansion for the semiconductor substrate and the deposited dielectric, there is a risk of the dielectric pealing off the substrate. Such problems are particularly likely to occur at the junction between the micro-cleaved laser facet and the dielectric film.

In a co-pending application (Ser. No. 07/458,152) by the same applicant commonly assigned the inventor discloses a method of stabilizing temperature-induced emission wavelength fluctuation in semiconductor diode lasers by assembling the laser together with a temperature-stabilized corrugated waveguide. The purpose of that procedure is to eliminate temperature-induced variations in wavelength, enabling tight control over wavelengths within 1 Å as necessary for advanced optical communications systems.

The procedure of hybrid assembling a temperature-stabilized Bragg reflector waveguide with a diode laser has many advantages over the prior art moralistically-integrated hybrid diode laser with waveguide, namely independent optimization of materials of each of the two components (laser and Bragg reflector) for their specific purpose and elimination of the Bragg grating process steps which degrade the laser active area. However, the stability of the external Bragg reflector is affected by mechanical alignment between the laser and Bragg reflector chip. The thickness of the active layer of the laser is typically about 0.1 micron for a conventional diode laser. This means that the wavelength of the separate chip must be aligned to the active layer to tolerances comparable to the active layer thickness. Even small shifts of less than 0.1 micron in the alignment of the waveguide chip with respect to the laser will result in a change in the operating point. For larger offsets, the coupling will be reduced and single-frequency operation may not be achieved, or may be intermittent. In addition, in the case of the temperature-stabilized laser the light launched into the waveguide must also be coupled back into the laser. This forces a waveguide to be approximately 0.1 micron thick, as well, to maintain efficient coupling in both directions.

An experimental solution to the alignment difficulty of external waveguides is to place the laser and waveguide on separate precision mechanical stages. This, however, is impractical for commercial application where trial-and-error adjustment is contrary to the concept of the off-the-shelf flexibility. See, e.g., J. M. Hammer, et al., Single Wavelength Operation of the Hybrid-External Bragg-Reflector-Waveguide Laser Under Dynamic Condition, Appl. Phys. Lett. 47(3) 1 Aug. 1985.

It would be desirable to provide a waveguide which provides the same effect as an external Bragg grating without the alignment difficulties involved with coupling an external waveguide to the laser which is to be stabilized. It is toward this object that the present invention is directed.

SUMMARY OF THE INVENTION

It is an advantage of the present invention to provide an improved device and method of temperature stabilization of the emission wavelength of diode lasers using rugate filters. In an exemplary embodiment, the rugate filter comprises a glass film which is deposited on one or both end facets of a conventional Fabry-Perot diode laser. The glass film has a continuously varying refractive index with thickness, usually in the form of a sine wave or a "windowed" sine wave. Such a film may be deposited by ion-assisted co-deposition techniques in which the concentration of the higher refractive index material is periodically varied according to the period required to produce the desired filter. The glass of which the rugate filter is formed has a refractive index which does not vary with temperature by more than $10^{-6}/°$ C. This is achieved by depositing a film comprising, for example, $(SiO_2)_x(Ta_2O_5)_{1-x}$, each component of which has an approximately equal and opposite index-temperature coefficient to the other, so that the net change in refractive index of the film with the temperature is as close to zero as possible.

The rugate filter is a sophisticated version of a Bragg grating. The filter reflects a peak wavelength $\lambda_p$ back into the laser according to the equation $\lambda_p = 2n_{eff}\Lambda$, where $\Lambda$ is the period of the sinusoidal variation of refractive index. By reflecting light at the peak wavelength back into the laser, the laser is caused to emit at the desired wavelength. Since the rugate filter selectively reflects light within a narrow band of the desired wavelength, the laser emits light within the same narrow band.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
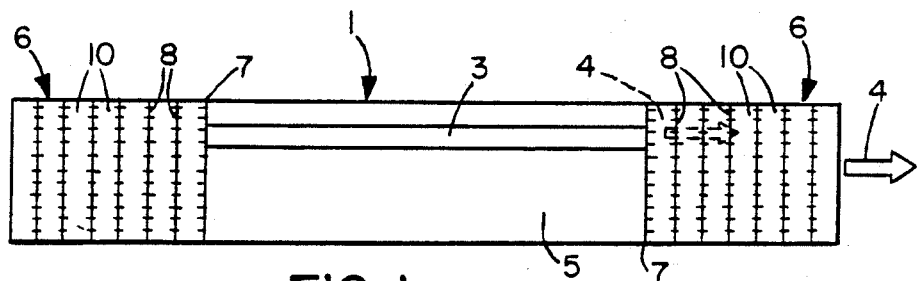
FIG. 1 is a diagrammatic side view of a laser with rugate filters according to the present invention.

As shown in FIG. 1, a conventional Fabry-Perot laser 1, comprises a substrate 5, an active layer 3, and two end facets 7 perpendicular to active layer 3 and the light path 4. Deposited on at least one end facet 7 is rugate filter 6.

Figure 6:
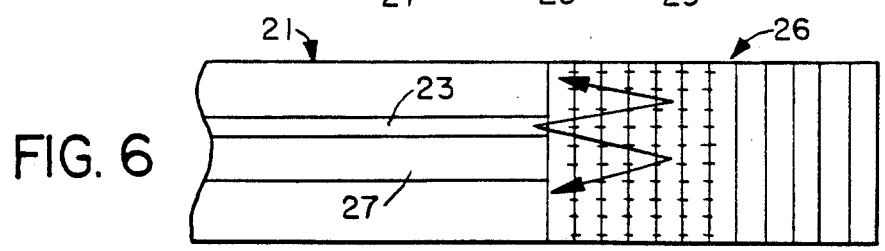
FIG. 6 is a thick rugate filter on a laser end facet to illustrate divergence.

Rugate filter 6 is a dielectric or glass film which has a continuously varying refractive index, usually in the form of a sine wave. The variation of refractive index occurs with a period which is determined according to the equation $\Lambda = \lambda/2n_{av}$ where $\Lambda$ is the peak-to-peak spacing of the refractive index period, $n_{av}$ is the average refractive index, and $\lambda$ is the desired wavelength for lasing. The difference between the maximum refractive index 8 and the minimum refractive index 10, and the total number of periods of sinusoidal variation, are determinant of the degree of reflection by the filter; the greater the index difference or number of periods, the greater the reflection. Typically, the reflectivity of the filter must fall within a range bounded by both an upper and a lower limit. When the reflectance is too high, a wider range of wavelengths around the desired center wavelength will be reflected, comparable to a deep Bragg grating which captures light in a wider band and reflects it back into the laser. This allows the laser to emit light over a broader band of wavelengths, thus allowing greater thermal drift of wavelength which defeats the purpose of the filter. When the reflectance is too low, many more cycles of refractive index variation are needed to produce a reasonable amount of reflection, and a narrower range of wavelengths will be captured and reflected back into the laser. However, the longer distance traveled increases the amount of loss caused by divergence of light within the filter so that much of the light is not reflected back into the laser, as shown in FIG. 6. A reflectance of 10% may be used, but as many as 100 cycles of refractive index variation may be required, and a substantial amount of light will be lost to divergence due to the distance traveled.

The film of the rugate filter 6 is preferably a co-deposited film of $SiO_2$ and $Ta_2O_5$. These two materials have approximately equal and opposite changes in refractive index with temperature (index-temperature coefficient), so that the net change with temperature is very small, on the order of $10^{-6}/°$ C.

Refractive index variation is produced by varying the ratio of $SiO_2$ to $Ta_2O_5$ during deposition, such variation occurring at the same frequency as the desired refractive index variation for the chosen wavelength. As an illustration, a desired center wavelength of 865 nm would require a refractive index variation cycle of approximately 2,444 Å, so at a film deposition rate of 1,000 Å per minute, the ratio of $SiO_2$ to $Ta_2O_5$ will need to be varied in cycles of approximately 2.4 minutes.

Figure 2:
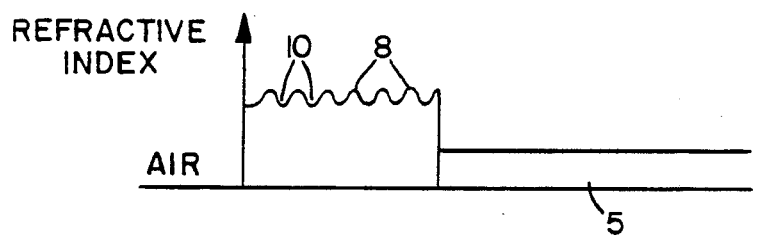
FIG. 2 is a graph of refractive index variation along a line running through the rugate filter and a portion of the substrate.

FIG. 2 illustrates the relative refractive indices of air, the filter 6 and the substrate 5. The variation within filter 6 is sinusoidal, where maximum refractive index film 8 ($n_{max}$) is potentially as high as 2.1, and minimum refractive index film 10 ($n_{min}$) may be as low as 1.45.

Figure 3:
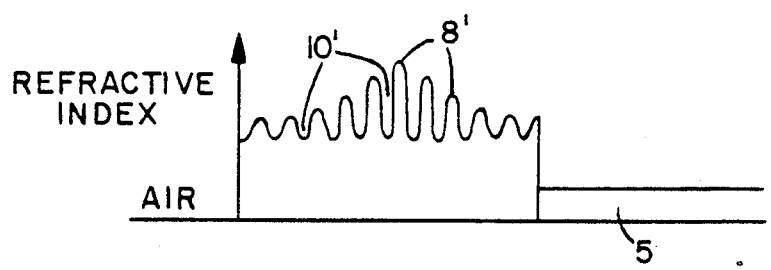
FIG. 3 is a graph of refractive index according to an alternate embodiment.
Figure 4:
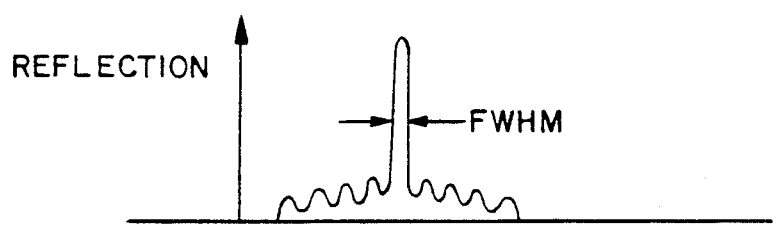
FIG. 4 is a graph of reflection versus wavelength for a rugate filter according to the alternate embodiment.

In an alternate embodiment, a "windowed" sine wave may be used as a refractive index variation, as shown in FIG. 3. The same period as in the first embodiment is used based upon the desired wavelength to be reflected, but the difference between $n_{max}$ and $n_{min}$ is increased within a narrow portion of the center of the film relative to the outer portions, providing a weighted distribution of refractive index variations within a narrow range. "Windowing" reduces the occurrence of reflections outside a desired range surrounding the center wavelength according to the Fourier transform of the refractive index variation. The concept is analogous to that employed in RF/Microwave communication systems for reducing the sidelobes of a filter. The resulting reflection spectrum is shown in FIG. 4, in which the reflectance curve has a full width at-half-maximum (FWHM) on the order of 10 Å or less.

A single rugate filter 6 may be deposited on one end facet 7, with a conventional partially reflecting mirror consisting of dielectric layers deposited on the opposite end facet 7. The output will be taken from the dielectric mirror side with the combination of the laser 1 and the rugate filter 6 exhibiting behavior similar to that of a distributed feedback laser (DBR) in which the Bragg grating spacing determines the laser wavelength. When rugate filters are deposited on both end facets 7, one of the rugate filters 6 must be only partially reflecting to permit escape of light from the laser 1. In such a device, both rugate filters would have the same periodic variation but one filter would have fewer periods of the sinusoidal variation for lower reflectivity.

The method of depositing the dielectric film on the end facets is preferably ion-assisted deposition, which involves the bombardment of the growing film with ions that break down the columnar structure which normally forms during deposition of refractory oxides such as $SiO_2$ and $Ta_2O_5$, thereby creating a nearly amorphous film. Adhesion is greatly improved by using the ion gun to sputter the facet surface immediately prior to deposition. Ion-assisted deposited films exhibit reduced index variations, primarily because the increased density significantly reduces the amount of water absorbed by the film.

Figure 5:
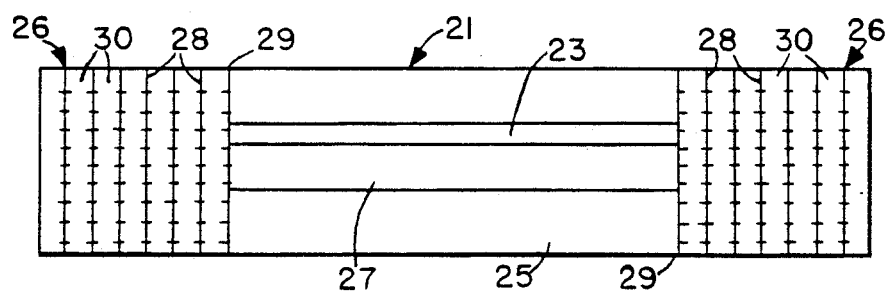
FIG. 5 is a diagrammatic side view of a second alternate embodiment of the present invention.

In a second alternate embodiment shown in FIG. 5, a large optical cavity (LOC) laser diode 21 has a waveguide layer 27 adjacent to the active layer 23, thereby permitting emission from a larger cross-sectional area of the end facets 29, reducing the divergence angle of the light emerging into the rugate filters 26. This also provides a larger area for coupling of reflected light from the rugate filters 26 back into the laser 21, again reducing the loss due to divergence.

It is known to deposit dielectric films onto the end facets of a diode laser, a common application being quarter-wave mirrors. The present invention provides a means for maintaining the emission wavelength within a tightly controlled range by depositing a dielectric film on the end facets. Such a laser has substantially reduced sensitivity to temperature-induced variations in refractive index and therefore experiences little or no shift in the center wavelength with temperature. Deposition directly onto the end facets eliminates the damaging effects of etching the substrate to form the facets and to permit formation of Bragg gratings on the same substrate as the laser as in the prior disclosures of Gurevich, et al. and Alferov, et al. Direct deposition of the filters onto the end facets also avoids the tight alignment tolerances required for laser-to-waveguide coupling with hybrid combinations of lasers and external waveguides.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A filter for temperature stabilization of a diode laser for emission at a desired wavelength comprising:
    a dielectric film deposited on at least one end facet of said diode laser, said film comprising a layer of dielectrics co-deposited with a periodic variation in the relative concentration of two dielectrics having approximately equal and opposite index-temperature coefficients, and a resultant periodically varying refractive index corresponding to said desired wavelength, each period being sinusoidal, said film having sufficient thickness to cover a plurality of periods, whereby said dielectric film acts like a Bragg grating to selectively reflect light of said desired wavelength back into said diode laser.

2. A filter as in claim 1 wherein a sine wave produced by said plurality of periods is windowed.

3. A filter as in claim 1 wherein said refractive index is periodically varied by varying during deposition the concentration of a higher refractive index substance in a sinusoidal manner having a period equal to that desired for said dielectric film.

4. A filter as in claim 1 wherein said film generally comprises $(SiO_2)_x (Ta_2O_5)_{1-x}$.

5. A filter as in claim 3 wherein said higher refractive index substance is $Ta_2O_5$ and said refractive index is varied by varying a ratio of $SiO_2$ to $Ta_2O_5$.

6. A filter as in claim 4 wherein said film is deposited by ion-assisted deposition.

* * * * *